(12) United States Patent
Lammers et al.

(10) Patent No.: US 9,747,934 B1
(45) Date of Patent: Aug. 29, 2017

(54) FLEXIBLE DYNAMIC LOOP WITH BACK-SIDE IMPEDANCE CONTROL STRUCTURES

(71) Applicant: SEAGATE TECHNOLOGY LLC, Cupertino, CA (US)

(72) Inventors: Todd M. Lammers, Lafayette, CO (US); Andrew R. Motzko, Delano, MN (US); Chau Chin Low, Fremont, CA (US); Matthew S. Graeff, Frederick, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 15/264,387

(22) Filed: Sep. 13, 2016

(51) Int. Cl.
  *G11B 5/48* (2006.01)
  *G11B 5/09* (2006.01)
(52) U.S. Cl.
  CPC .............. *G11B 5/4846* (2013.01); *G11B 5/09* (2013.01)
(58) Field of Classification Search
  CPC .................................. G11B 5/48; G11B 5/4846
  USPC ................................................ 360/264–264.5
  See application file for complete search history.

(56) References Cited

U.S. PATENT DOCUMENTS

| 8,902,547 | B1 | 12/2014 | Zhong |
| 8,934,200 | B2 | 1/2015 | Shivarama et al. |
| 9,013,963 | B2 | 4/2015 | Ver Meer et al. |
| 9,131,605 | B2 | 9/2015 | Cayaban et al. |
| 9,253,885 | B2 | 2/2016 | Shivarama et al. |
| 2004/0113250 | A1* | 6/2004 | Khandros ............. H01L 23/13 257/680 |
| 2010/0025835 | A1* | 2/2010 | Oh .......................... H01L 25/03 257/686 |
| 2010/0231331 | A1* | 9/2010 | Toyoshima ........ H05K 1/0224 333/238 |
| 2014/0374148 | A1* | 12/2014 | Su ....................... H05K 3/4061 174/254 |

FOREIGN PATENT DOCUMENTS

CN    104272387 A    1/2015

OTHER PUBLICATIONS

Chen et al., "Vision-Assisted Vibration Analysis of Inhomogeneous Flexible Cables in Hard Disk Drives," IEEE Transactions on Magnetics, vol. 49, No. 6, Jun. 2013 (p. 2628-2633).

* cited by examiner

*Primary Examiner* — Allen T Cao
(74) *Attorney, Agent, or Firm* — Holland & Hart LLP

(57) ABSTRACT

Systems and methods for a flexible dynamic loop having reduced impedance are described. The flexible dynamic loop may supply current from a preamplifier to another device, such as a hard disk drive. In one embodiment, a flexible dynamic loop comprises a flexible structure having a set of wire traces. The flexible dynamic loop may also comprise a set of impedance control structures on the flexible structure and perpendicular to a bend radius of the flexible structure, wherein the set of impedance control structures change an impedance level experienced by at least some of the set of wire traces. Some of the impedance control structures may be staggered. The flexible dynamic loop may also include a cover layer formed over the set of impedance control structures, which may be patterned with perforations. The flexible dynamic loop may also include one or more flexible rails connecting some of the impedance control structures.

20 Claims, 12 Drawing Sheets

FLEXIBLE DYNAMIC LOOP WITH BACK-SIDE IMPEDANCE CONTROL STRUCTURES

SUMMARY

The present disclosure is directed to apparatus, systems, and methods for providing a flexible dynamic loop via impedance control structures in a disc drive. In some embodiments, the present systems and methods may reduce the real estate required for the flexible dynamic loop and may increase the flexibility of the flexible dynamic loop.

A flexible dynamic loop is described. One example of a flexible dynamic loop may include a flexible structure having a set of wire traces and a set of impedance control structures on the flexible structure. The set of impedance control structures may be oriented substantially perpendicular to a bend radius of the flexible structure, wherein the set of impedance control structures change an impedance level experienced by at least some of the set of wire traces.

The flexible dynamic loop may also include a cover layer formed over the set of impedance control structures. The cover layer may be patterned with perforations. The flexible dynamic loop may also include a flexible layer formed between the set of wire traces and the set of impedance control structures.

In some examples, the set of impedance control structures further includes a first set of impedance control structures and a second set of impedance control structures. The second set of impedance control structures are staggered along a length of the flexible structure relative to the first set of impedance control structures. The flexible dynamic loop may further include at least one flexible rail connecting at least some of the set of impedance control structures, wherein the at least one flexible rail is formed along a length of the flexible structure.

In additional examples, the flexible dynamic loop may also include a first polyimide cover layer formed over the set of wire traces and a first adhesive layer formed around the set of wire traces and under the first polyimide cover layer. The flexible structure may be a middle layer formed between the set of wire traces and the set of impedance control structures. The flexible dynamic loop may also include a second adhesive layer formed around the set of impedance control structures and a second polyimide cover layer formed over the second adhesive layer.

The set of impedance control structures may change the impedance level by causing an electrical notch in frequency content at a wavelength divided by two, which is higher than a frequency of a differential path of the set of wire traces.

In some examples, each of the set of impedance control structures are placed a distance apart such that a mechanical stiffness of the flexible dynamic loop is below a stiffness threshold. The set of wire traces may be grouped into differential pairs and a length of each impedance control structure may be longer than an area of the flexible structure covered by a differential pair of wire traces. In some examples, a first end of the flexible dynamic loop communicatively couples with circuitry for a hard disk drive and a second end of the flexible dynamic loop communicatively couples with a channel preamplifier.

Two adjacent impedance control structures may be separated by a window percentage, wherein the window percentage is a ratio of a width of an impedance control structure and a pitch between two adjacent impedance control structures. The flexible dynamic loop may also include bumps formed on at least some of the set of wire traces, wherein each bump overlays an impedance control structure of the set of impedance control structures.

A storage system apparatus is also described. The storage system apparatus may include a preamplifier to supply current to a storage device and a system-on-a-chip (SOC) of the storage device. The storage system apparatus may also include a flexible dynamic loop connecting the preamplifier to the SOC. The flexible dynamic loop may also include a flexible structure having a set of wire traces and a set of impedance control structures on the flexible structure. The set of impedance control structures may be oriented substantially perpendicular to a bend radius of the flexible structure, wherein the set of impedance control structures change an impedance level experienced by at least some of the set of wire traces.

The storage system apparatus may further include a cover layer formed over the set of impedance control structures, wherein the cover layer is patterned with perforations. In some examples, the set of impedance control structures further includes a first set of impedance control structures and a second set of impedance control structures, wherein the second set of impedance control structures are staggered along a length of the flexible structure relative to the first set of impedance control structures, wherein each of the set of impedance control structures are placed a distance apart such that a mechanical stiffness of the flexible dynamic loop is below a stiffness threshold.

The storage system apparatus may further include at least one flexible rail connecting at least some of the set of impedance control structures, wherein the at least one flexible rail is formed along a length of the flexible structure. The storage system apparatus may further include a first polyimide cover layer formed over the set of wire traces, a first adhesive layer formed around the set of wire traces and under the first polyimide cover layer, a middle layer formed between the set of wire traces and the set of impedance control structures, a second adhesive layer formed around the set of impedance control structures, and a second polyimide cover layer formed over the second adhesive layer.

Some methods are also described herein. One example method includes transmitting current from a preamplifier to an SOC of a disk drive via a flexible dynamic loop coupled between the preamplifier and the SOC and controlling, at least partially, impedance in the flexible dynamic loop due to the current via a plurality of impedance control structures formed on the flexible dynamic loop. Controlling, at least partially, the impedance in the flexible dynamic loop may further include reducing impedance in a plurality of wire traces in the flexible dynamic loop.

The foregoing has outlined rather broadly the features and technical advantages of examples according to this disclosure so that the following detailed description may be better understood. Additional features and advantages will be described below. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein—including their organization and method of operation—together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following figures. In the appended figures, similar components or features may have the same reference label. Further, various components of the same type may be distinguished by following a first reference label with a dash and a second label that may distinguish among the similar components. However, features discussed for various components—including those having a dash and a second reference label—may apply to other similar components. If only the first reference label is used in the specification, the description is applicable to any one of the similar components having the same first reference label irrespective of the second reference label.

DETAILED DESCRIPTION

Figure 1:
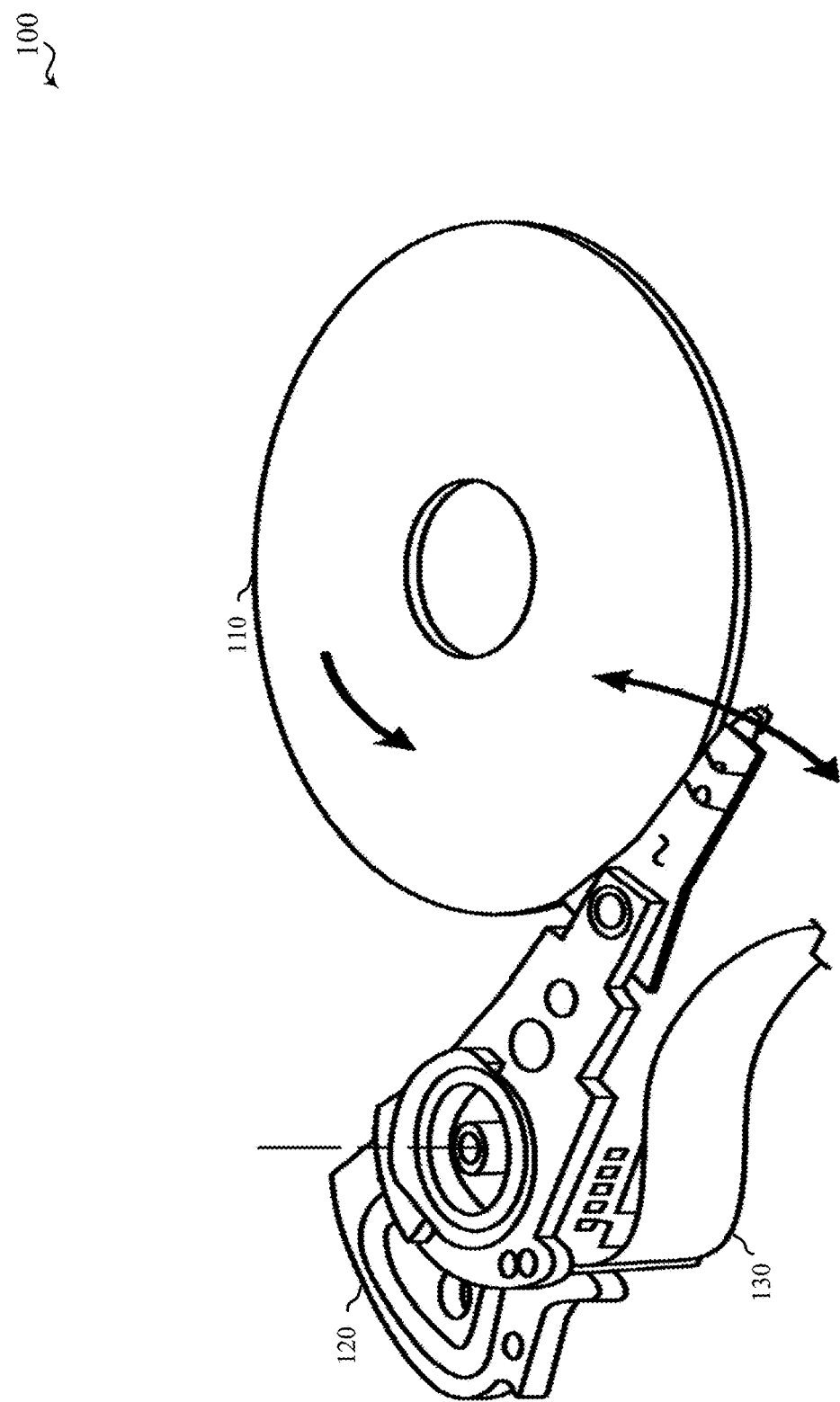
FIG. 1 is a diagram of an example of a system in accordance with various embodiments.

The following relates generally to interconnects between a system-on-a-chip (SOC) and a preamplifier in a disc drive, particularly to flexible dynamic loops. A flexible dynamic loop may connect a head stack assembly (HSA) of a disc drive to a drive controller. The flexible dynamic loop may connect a preamplifier on the HSA with the SOC, which may include a drive controller.

As the number of interconnects between the SOC and the preamplifier continue to increase, the available real-estate does not scale. One bottleneck for this interconnect path is a region called the flexible dynamic loop which runs from a connector mated to the printed circuit board assembly (PCBA) to the HSA. The mechanical design of the flexible dynamic loop may be very specific for proper drive operation and servo performance. Due to the fixed mechanical size and shape, there is a hard limit to the number of interconnects that can physically exist in the available real estate. However, the minimum manufactural trace cannot be used while maintaining performance and reliability in most cases. For example, a voice coil motor (VCM) and power supply lines need to be of sufficient size to carry the needed current and to allow for a low impedance and low inductance supply path. Additionally, the high data-rate Read/Write signal lines have specific bandwidth and impedance requirements that dictate a certain trace size and spacing in the backed and un-backed portions of the signal path. These restrictions limit the number of functional high frequency differential pairs that can be added to enable additional read and write functionality.

Techniques of the present disclosure provide for a flexible dynamic loop with impedance control structures. This allows for a reduction in the width of wire traces, particularly for high speed differential pairs. In some examples, the impedance control structures may be a dual layer copper flex circuit. Periodic impedance control structures on a second layer, which may be copper (Cu), add additional capacitance such that the trace widths can be reduced. This saves significant space on the flexible dynamic loop.

In some examples, the impedance control structures may be discontinuous along the length of the flexible dynamic loop. The size, numbers, location, and design of the impedance control structures may be chosen to satisfy mechanical metrics, such as stiffness, and meet any multi-seek reliability needs. The impedance control structures may be placed perpendicular to a bend radius of the flexible dynamic loop. This geometry may reduce any added stiffness that might result from the additional material in the dynamic loop bend. Spacing the impedance control structures and strategically including holes other material discontinuities in the material may provide additional freedom to bend.

The periodicity of the impedance control structures can be designed based in part on balancing electrical performance with mechanical needs. For example, the spacing between adjacent impedance control structures (referred to herein as a pitch window, or just pitch) may be set or adjusted such that an electrical notch in a frequency content caused by the impedance discontinuity at half of a wavelength ($\lambda/2$) may be above a bandwidth of a differential path. Additionally, the pitch and an impedance control structure's width may be selected to maximize bandwidth and impedance flatness. To keep the mechanical performance high, the impedance control structures may be spaced far enough apart to stay below a mechanical stiffness requirement. Stress may be inversely proportional to the pitch of the impedance control structures.

To avoid material flake off and damage in handling, the impedance control structures can be contained within a secondary cover layer. This additional layer may add stiffness and may also change the neutral axis of the flexible dynamic loop. In some examples, periodic punched out slots are provided in the cover layer to reduce the stiffness in the flexible dynamic loop. The punched out slots may be either full or partial width to allow bending. Other techniques might include a honey comb pattern punch out of the cover layer to reduce its stiffness yet provide protection to the impedance control structures. This design may provide a trade-off in protecting the backside impedance control structures for a reduction in stiffness while avoiding the creasing effect from perforation.

FIG. 1 is a diagram of an example of a system 100 in which the present systems and methods may be implemented. The system 100 may include a disc 110, a head stack assembly 120, and a flexible dynamic loop 130. The disc 110 may be a hard disc drive, any type of magnetic storage device, or a hybrid drive. The disc 110 may be a shingled magnetic recording (SMR) drive, any small form-factor drive that uses multi-sensor magnetic recording (MSMR) plus heat assisted magnetic recording (HAMR), or any form-factor drive using MSMR or any other combination of multiple read, write, or other high speed signal lines. In some embodiments, the systems and methods described herein may be performed on a single disc 110. In some cases, the systems and methods described herein may be used with multiple storage devices or a network of storage devices.

The head stack assembly 120 may receive read and write operations for the disc 110, control signals, and power via wire traces in the flexible dynamic loop 130. The wire traces may be paired into differential pairs. The flexible dynamic loop 130 is further connected to a PCBA which may include, or be coupled to, a drive controller. The head stack assembly 120 may be free to move to different locations on the disc 110. Therefore, the flexible dynamic loop 130 may be able to move to accommodate the motion of the HSA 120.

The flexible dynamic loop 130 may include a flexible structure having a set of wire traces. The flexible dynamic loop 130 may also include a set of impedance control structures on the flexible structure and perpendicular to a bend radius of the flexible structure, wherein the set of impedance control structures change an impedance level experienced by at least some of the set of wire traces. The flexible dynamic loop 130 may reduce the real-estate needed for differential pairs in the flexible dynamic loop 130 by using dual layer impendence control structures (e.g., copper) that do not inhibit mechanical performance of flex bending.

Figure 2:
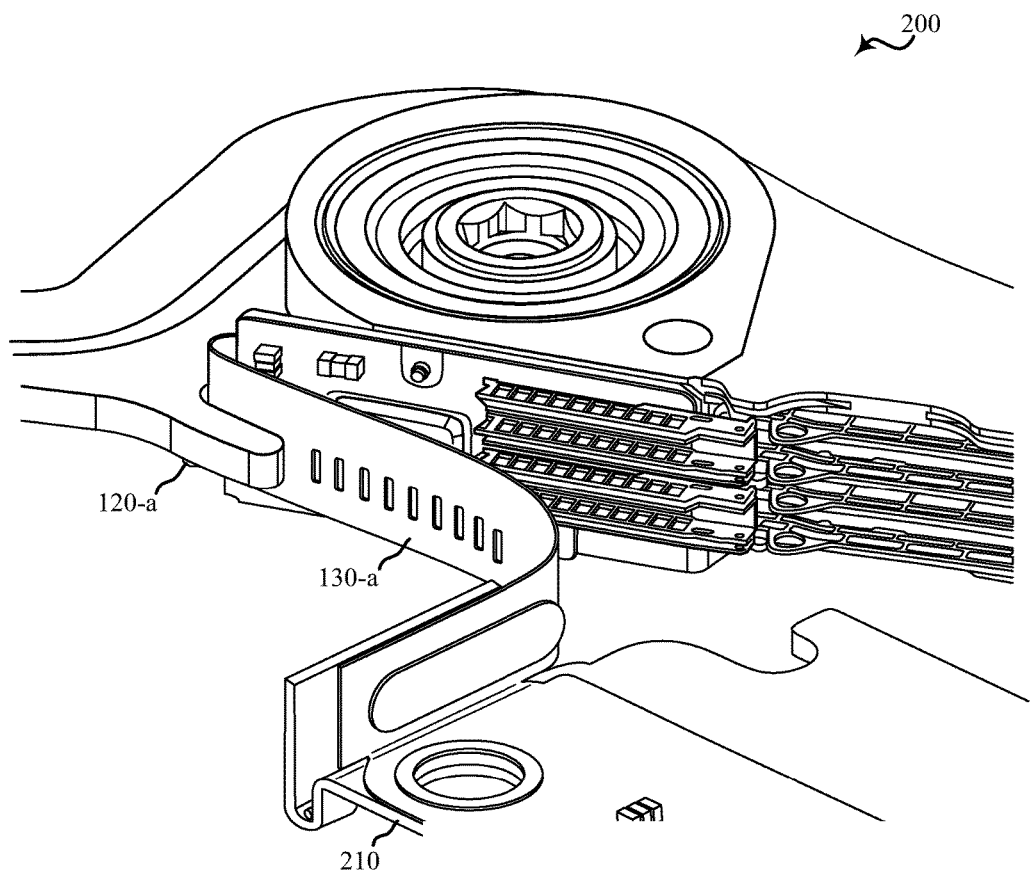
FIG. 2 shows a diagram of a device in accordance with various aspects of this disclosure.

FIG. 2 shows a diagram of a device 200 in accordance with various aspects of this disclosure. The device 200 may be an example of one or more aspects of the system 100 described with reference to FIG. 1. The device 200 may include an HSA 120-a, a flexible dynamic loop 130-a and a PCBA 210. The HSA 120-a and the flexible dynamic loop 130-a may be an example of one or more aspects of the HSA 120 and the flexible dynamic loop 130 of FIG. 1, respectively.

The flexible dynamic loop 130 may include a plurality of impedance control structures. These impedance control structures may reduce the impedance of wire traces in the flexible dynamic loop 130-a while not preventing or substantially inhibiting the flexible dynamic loop 130-a from bending.

Figure 3:
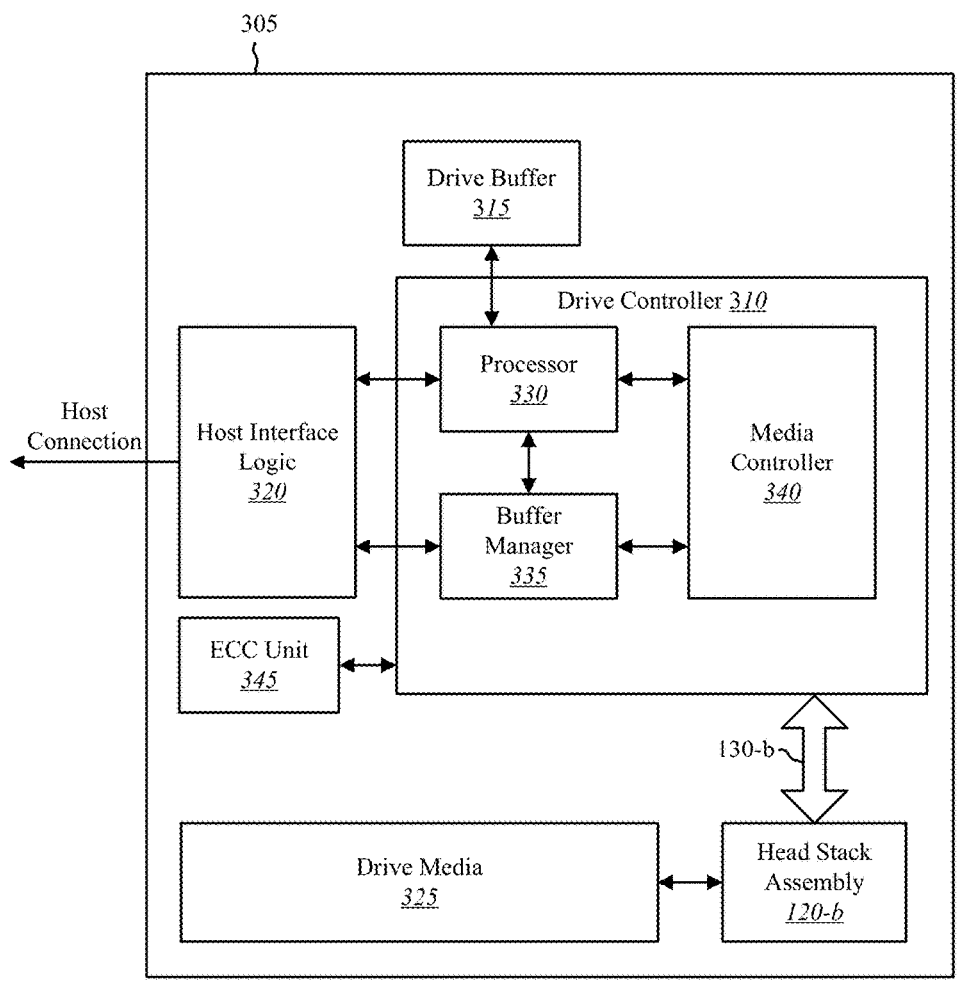
FIG. 3 shows a diagram of a system in accordance with various aspects of this disclosure.

FIG. 3 shows a block diagram 300 of an apparatus 305 for use in electronic communication, in accordance with various aspects of this disclosure. The apparatus 305 may be an example of one or more aspects of the system 100 or the device 200 described with reference to FIGS. 1 and 2. The apparatus 305 may include a drive controller 310, a drive buffer 315, a host interface logic 320, a flexible dynamic loop 130-b, an HSA 120-b, and a drive media 325. The HSA 120-b and the flexible dynamic loop 130-b may be an example of one or more aspects of the HSA 120 and the flexible dynamic loop 130 of FIGS. 1 and 2, respectively. The drive controller 310 may be coupled to the flexible dynamic loop 130-b. Each of these components may be in communication with each other and/or other components directly and/or indirectly.

One or more of the components of the apparatus 305, individually or collectively, may be implemented using one or more application-specific integrated circuits (ASICs) adapted to perform some or all of the applicable functions in hardware. Alternatively, the functions may be performed by one or more other processing units (or cores), on one or more integrated circuits. In other examples, other types of integrated circuits may be used (e.g., Structured/Platform ASICs, Field Programmable Gate Arrays (FPGAs), and other Semi-Custom ICs), which may be programmed in any manner known in the art. The functions of each component may also be implemented—in whole or in part—with instructions embodied in memory formatted to be executed by one or more general and/or application-specific processors.

In one embodiment, the drive controller 310 may include a processor 330, a buffer manager 335, and a media controller 340. The drive controller 310 may process, via the processor 330, read and write requests in conjunction with the host interface logic 320, which acts as an interface between the apparatus 305 and a host of apparatus 305 (e.g., an operating system, host hardware system, etc.). The drive buffer 315 may hold data temporarily for internal operations of the apparatus 305. For example, a host may send data to the apparatus 305 with a request to store the data on the drive media 325. The drive controller 310 may process the request and cause the drive media 325 to store the received data. In some cases, a portion of data stored in the drive media 325 may be copied to the drive buffer 315 and the processor 330 may process or modify this copy of data and/or perform an operation in relation to this copy of data held temporarily in the drive buffer 315.

Examples of the apparatus 305 include a storage server, a storage enclosure, a storage controller, storage drives in a distributed storage system, storage drives on a cloud storage system, storage devices on personal computing devices, storage devices on a server, or any combination thereof. In some configurations, the apparatus 305 may include the flexible dynamic loop 130-b.

In one embodiment, the apparatus 305 may be a computing device with one or more processors, memory, and/or one or more storage devices. In some cases, the apparatus 305 may include a wireless storage device. In some embodiments, the apparatus 305 may include a cloud drive for a home or office setting. In one embodiment, the apparatus 305 may include a network device such as a switch, router, access point, or any combination thereof. In one example, the apparatus 305 may be operable to receive data streams, store and/or process data, and/or transmit data from, to, or in conjunction with one or more local and/or remote computing devices. Furthermore, software and/or firmware (e.g., stored in memory) may be executed on a processor of the apparatus 305. Such software and/or firmware executed on the processor may be operable to cause the apparatus 305 to monitor, process, summarize, present, and/or send a signal associated with the operations described herein.

In one embodiment, the drive media 325 may be external to the storage device 110. As one example, the apparatus 305 may include a storage controller that interfaces with storage media of the drive media 325. The flexible dynamic loop 130-b may provide signals to the HSA 120-b to perform read and write operations to the drive media 325.

Figure 4A:
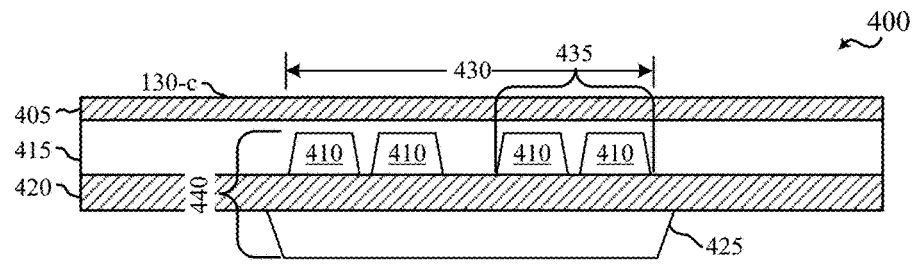
FIGS. 4A-4D show examples of a flexible dynamic loop having impedance control structures in accordance with various aspects of this disclosure.

FIGS. 4A-4D show examples of a flexible dynamic loop 130 having impedance control structures in accordance with various aspects of this disclosure. FIG. 4A shows a cross sectional view 400 of a flexible dynamic loop 130-c. The flexible dynamic loop 130-c may include a cover layer 405, an adhesive layer 415, and a baselam layer 420. The adhesive layer 415 may include a plurality of wire traces 410 (or, in other words, a plurality of traces may be embedded within the adhesive layer). The wire traces 410 may be comprised of copper. In other examples, the wire traces 410 are made from other types of conductive materials. The wire traces 410 may be coupled into differential pairs, such as the differential pair 435. A width 430 of the two differential pairs of wire traces 410 is shown.

On the side of the baselam layer 420 opposite from the wire traces 410, the flexible dynamic loop 130-c includes one or more impedance control structures 425. In some examples, the impedance control structures 425 may be made from copper. In other examples, the impedance control structures 425 are made from other types of conductive materials. In the example of FIG. 4A, a single impedance control structure 425 is wider than, or extends beyond, the overall width of the two sets of differential paired wire traces 410. The impedance control structure 425 reduces the impedance of the wire traces 410 in the flexible dynamic loop 130-c. In prior art structures, without the impedance control structure 425, the width 430 would have to be substantially increased because impedance control had to be provided through maximizing a capacitance between the wire traces 410 of a differential pair 435. Since spacing on the flexible dynamic loop 130-*c* is small, having to increase the width 430 limits the real estate available on the flexible dynamic loop 130-*c*.

In some examples, the cover layer 405-*a* is a polyimide cover layer. In other examples, the cover layer 405-*a* may comprise any thermoplastic, other flexible polymer, or any other suitable material. The adhesive layer 415 may comprise silicon, acrylic, epoxies, fluropolymer adhesives, or any other suitable material. The baselam layer 420 may also be referred to herein as a flexible structure. The baselam layer 420 may comprise any thermoplastic, other flexible polymer, or any other suitable material. As previously noted, in some examples, the wire traces 410 and the impedance control structures 425 may be made from Cu.

Figure 4B:
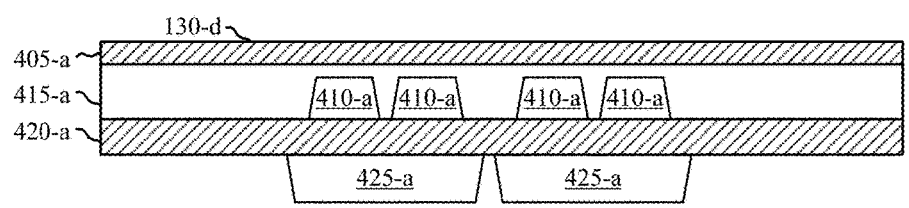

FIG. 4B shows a cross sectional view 400-*a* of a flexible dynamic loop 130-*d*. The flexible dynamic loop 130-*d* may include a cover layer 405-*a*, an adhesive layer 415-*a*, a baselam layer 420-*a*, a plurality of wire traces 410-*a* within the adhesive layer 415-*a*, and two impedance control structures 425-*a*. The cover layer 405-*a*, the adhesive layer 415-*a*, the baselam layer 420-*a*, the wire traces 410-*a*, and the impedance control structures 425-*a* may be examples of one or more aspects of the likewise named features of FIG. 4A.

The flexible dynamic loop 130-*d* includes at least two impedance control structures 425-*a* as shown in FIG. 4B. In this example, each impedance control structure 425-*a* is opposite a differential pair of wire traces 410-*a*. The impedance control structures 425-*a* may be electrically isolated from each other. In some examples, the impedance control structures 425-*a* may be electrically coupled together, such as grounded. The wire traces 410 and the impedance control structures 425-*a* may be periodically located along the flexible dynamic loop 130-*d*.

Figure 4C:
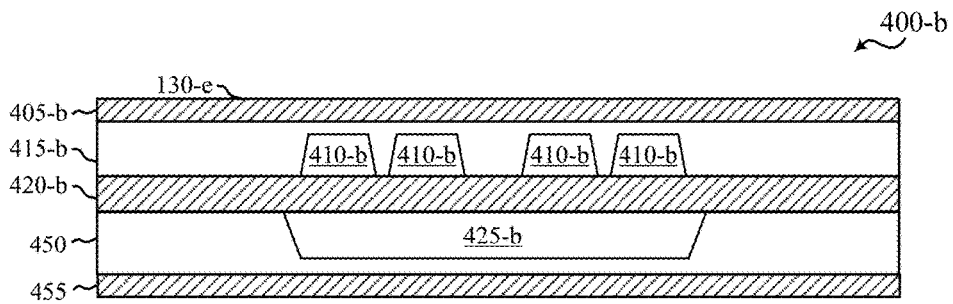

FIG. 4C shows a cross sectional view 400-*b* of a flexible dynamic loop 130-*e*. The flexible dynamic loop 130-*e* may include a cover layer 405-*b*, an adhesive layer 415-*b*, a baselam layer 420-*b*, a plurality of wire traces 410-*b* within the adhesive layer 415-*b*, and an impedance control structure 425-*b*. The cover layer 405-*b*, the adhesive layer 415-*b*, the baselam layer 420-*b*, the wire traces 410-*b*, and the impedance control structures 425-*b* may be examples of one or more aspects of the respective features of FIGS. 4A-4B.

In the example shown in FIG. 4C, the flexible dynamic loop 130-*e* includes a second adhesive layer 450 in addition to the first adhesive layer 415-*b*. The second adhesive layer 450 is formed around the impedance control structure 425-*b* (or, in other words, the impedance control structure 425-*b* is embedded in the second adhesive layer 450). A second cover layer 455 is formed over the second adhesive layer 450. The second cover layer 455 and the second adhesive layer 450 may protect the impedance control structure 425-*b* from damage.

Figure 4D:
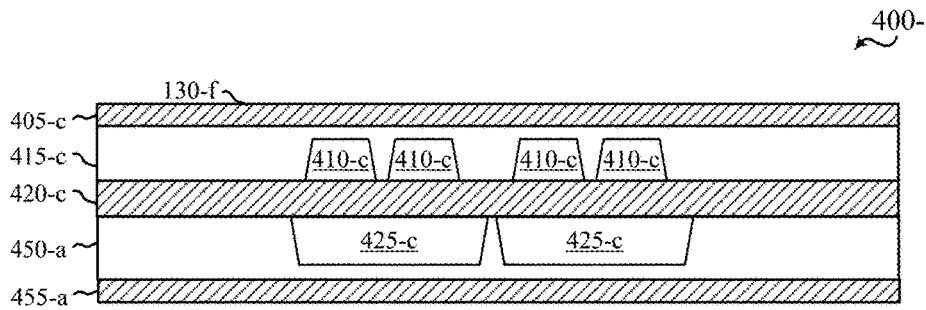

FIG. 4D shows a cross sectional view 400-*c* of a flexible dynamic loop 130-*f*. The flexible dynamic loop 130-*f* may include a first cover layer 405-*c*, a first adhesive layer 415-*c*, a baselam layer 420-*c*, a plurality of wire traces 410-*c* within the adhesive layer 415-*c*, two impedance control structures 425-*c*, a second adhesive layer 450-*a*, and a second cover layer 455-*a*. The cover layer 405-*c*, the adhesive layer 415-*c*, the baselam layer 420-*c*, the wire traces 410-*c*, and the impedance control structures 425-*c* may be examples of one or more aspects of the respective features of FIGS. 4A-4C. Furthermore, the second adhesive layer 450-*a* and the second cover layer 455-*a* may be examples of one or more aspects of the second adhesive layer 450 and the second cover layer 455 of FIG. 4C.

The flexible dynamic loops 130-*c*, 130-*d*, 130-*e*, and 130-*f* of FIGS. 4A-4D may be examples of one or more aspects of the flexible dynamic loop 130 of FIGS. 1-3. FIGS. 4A-4D illustrate a flexible dynamic loop including a flexible structure having a set of wire traces and a set of impedance control structures on the flexible structure. The set of impedance control structures may be arranged approximately perpendicular to a bend radius of the flexible structure, wherein the set of impedance control structures change an impedance level experienced by at least some of the set of wire traces. In other examples, the set of impedance control structures may be placed at a different angle with respect to the bend radius of the flexible structure.

FIGS. 5A-5F show further examples of a flexible dynamic loop 130-*g* through 130-*l* having impedance control structures in accordance with various aspects of this disclosure. FIGS. 5A-5F show a backside view of the flexible dynamic loop 130, showing the impedance control structures 425 (also referred to herein as copper islands) under the differential pair wire traces 410. The flexible dynamic loops 130-*g* through 130-*l* of FIGS. 5A-5F may be examples of one or more aspects of the flexible dynamic loop 130 of FIGS. 1-4.

Figure 5A:
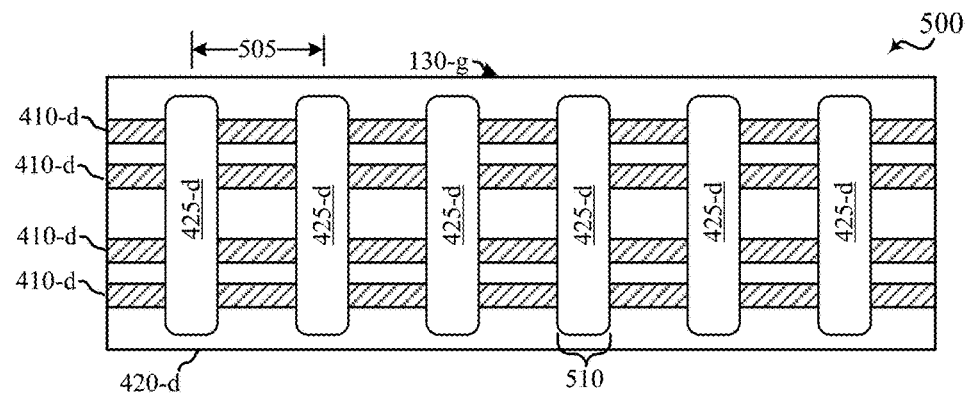
FIGS. 5A-5F show further examples of a flexible dynamic loop having impedance control structures in accordance with various aspects of this disclosure.

FIG. 5A shows a back view 500 of wire traces 410-*d* and impedance control structures 425-*d* spaced periodically over the wire traces 410-*d*. For illustrative purposes, the wire traces 410-*d* are not visually obstructed by a flexible layer 420-*d*, but it is understood that the wire traces 410-*d* and the impedance control structures 425-*d* are not in electrical connection and have the flexible layer 420-*d* formed between them. This applies to FIGS. 5B-5F and 6A-6C as well.

A pitch 505 is shown between adjacent impedance control structures 425-*d*. A width 510, which may be denoted W1, is a width of an impedance control structure 425-*d* or island width. Impedance can be further tuned using pitch 505 and island width 510 in addition to trace width and spacing. That is, the pitch 505 and the width 510 may be selected for a specific impedance value and a specific stiffness value. A ratio of width 510 to pitch 505 may be referred to as a window percentage, given in Equation 1.

$$\text{Window \%} = \frac{W1}{\text{Pitch}} \quad (1)$$

Therefore, the width 510 and the pitch 505 may be selected to achieve a particular window percentage. The relationship for mechanical stiffness with respect to the pitch 505 and the width 510 is opposite that of its effect on impedance. There are some values of pitch 505 and width 510 where the pitch 505 is large enough to reduce the impedance but small enough not to adversely affect the stiffness. In some examples, the window percentage may be anywhere from approximately 10 to 90%. In other examples, other window percentages may be used.

In some examples, the flexible dynamic loop 130-*g* includes a set of impedance control structures 425-*d* that are placed a distance apart such that a mechanical stiffness of the flexible dynamic loop 130-*g* is below a stiffness threshold. In another example, two adjacent impedance control structures 425-*d* may be separated by a window percentage, wherein the window percentage is a ratio of the width 510 of an impedance control structure 425-*d* and a pitch 505 between two adjacent impedance control structures.

Figure 5B:
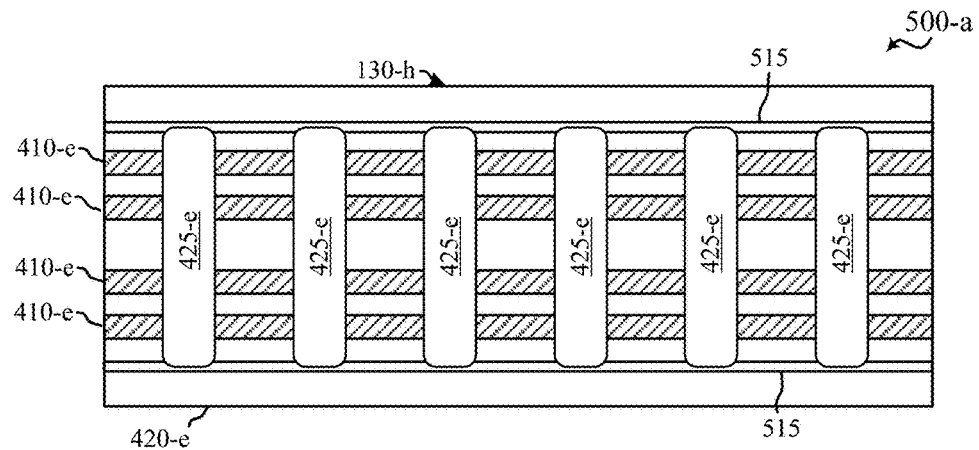

FIG. 5B shows a back view 500-*a* of wire traces 410-*e* and impedance control structures 425-*e* in a flexible dynamic loop 130-*h*. The flexible dynamic loop 130-*h* also includes flexible rails 515 that connect the impedance control structures 425-*e*. In some examples, the flexible dynamic loop 130-*h* includes at least one flexible rail 515 connecting at least some of the set of impedance control structures 425-*e*, wherein the at least one flexible rail 515 is formed along a length of the flexible structure or middle layer 420-*e*.

The discontinuous impedance control structures 425-*e* may present a problem for mode conversions and maintaining common mode return current continuity. This may manifest itself into reduced common mode rejection and reduced immunity during electromagnetic compatibility testing. To avoid some of these problems, a small conductive strip, referred to herein as flexible rails 515, can be run down the length of the impedance control structures 425-*e* to connect them and allow for a continuous common mode path in the dynamic region. The width of these flexible rails 515 may be kept at or below a threshold thickness level to avoid adding unwanted stiffness in the lateral direction.

In some examples, the flexible rails 515 may be made of a conductive material, such as Cu. The flexible rails 515 may be connected to the impedance control structures 425-*e* and allow for continuous common mode current to flow. This can improve immunity and common mode rejection. However, the flexible rails 515 may add stiffness to the flexible dynamic loop 130-*h*. Therefore, the flexible rails 515 may be sized small to reduce the impact on the flexibility. In some examples, only a single flexible rail 515 is included. In other examples, two or more flexible rails 515 are used.

Figure 5C:
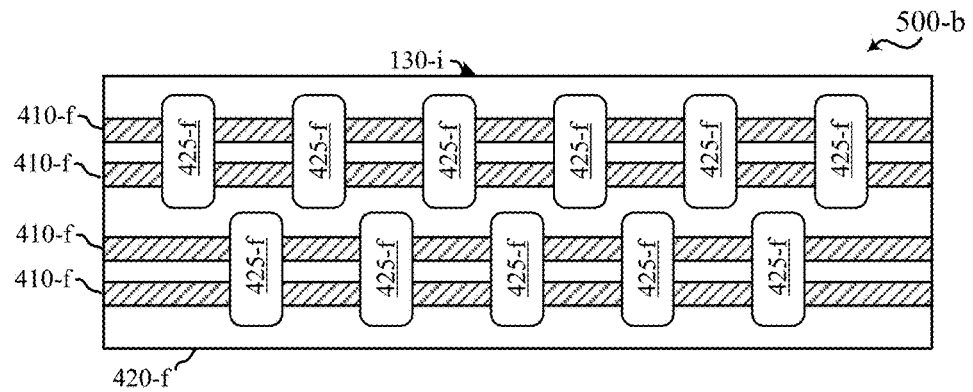

FIG. 5C shows a back view 500-*b* of wire traces 410-*f* and impedance control structures 425-*f* in a flexible dynamic loop 130-*i*. In this example, the impedance control structures 425-*f* extend a small amount beyond a single differential pair of wire traces 410-*f* and are staggered. For example, the impedance control structures 425-*f* may include a first set of impedance control structures 425-*f* and a second set of impedance control structures 425-*f*, wherein the second set of impedance control structures 425-*f* are staggered along a length of the flexible structure 420-*f* compared with the first set of impedance control structures 425-*f*.

Figure 5D:
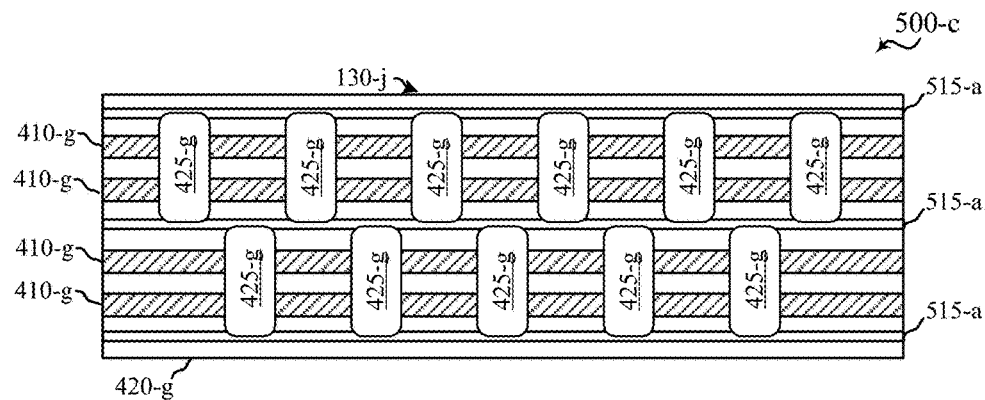

FIG. 5D shows a back view 500-*c* of wire traces 410-*g* and impedance control structures 425-*g* in a flexible dynamic loop 130-*j*. In this example, the impedance control structures 425-*g* are staggered like in the example of FIG. 5C but also include flexible rails 515-*a* like in the example of FIG. 5B. As shown here, the flexible dynamic loop 130-*j* includes three flexible rails 515-*a*. The staggered impedance control structures 425-*g* provide for additional differential pair isolation and the flexible rails 515-*a* provide for improved common mode return (CMR). The middle flexible rail 515-*a* may be included for added balance and continuity of CMR.

Figure 5E:
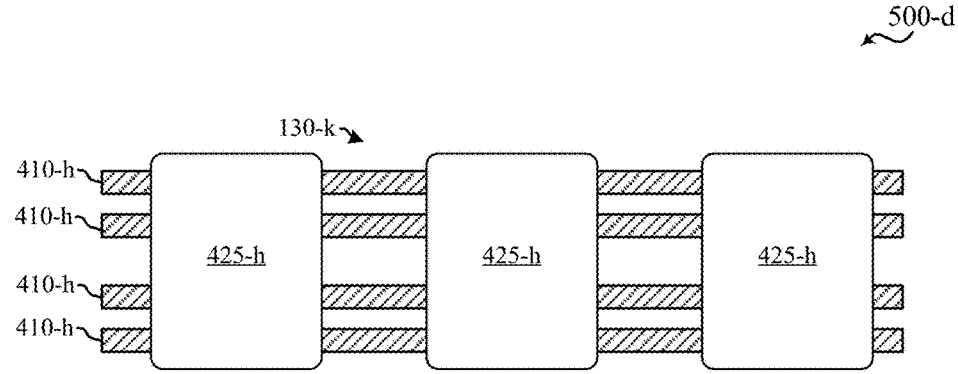

FIG. 5E shows a back view 500-*d* of wire traces 410-*h* and large impedance control structures 425-*h* in a flexible dynamic loop 130-*k*. This example shows large islands of the impedance control structures 425-*h*. For example, the width 510 may be relatively large. These large islands may provide for low impedance but may have a greater impact on the flexibility of the flexible dynamic loop 130-*k*.

Figure 5F:
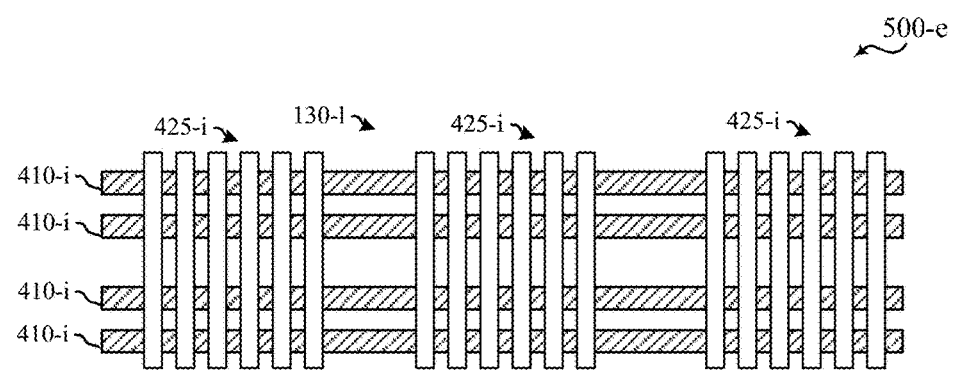

FIG. 5F shows a back view 500-*e* of wire traces 410-*i* and thin islands of impedance control structures 425-*i* in a flexible dynamic loop 130-*k*. This example may provide reduced mechanical impact with approximately the same electrical response as the embodiment described with respect to FIG. 5E. This example provides very fine spacing between control structures 425-*i* perpendicular to the bend radius. This may look electronically equivalent to the structure shown in FIG. 5E within a frequency band of interest. In example where the impedance control structures 425-*i* should be large, hatching or patterning the impedance control structures 425-*i* such as shown in FIG. 5F may substantially reduce the bending stiffness otherwise imparted by impedance control structures to the resulting structure.

Figure 6A:
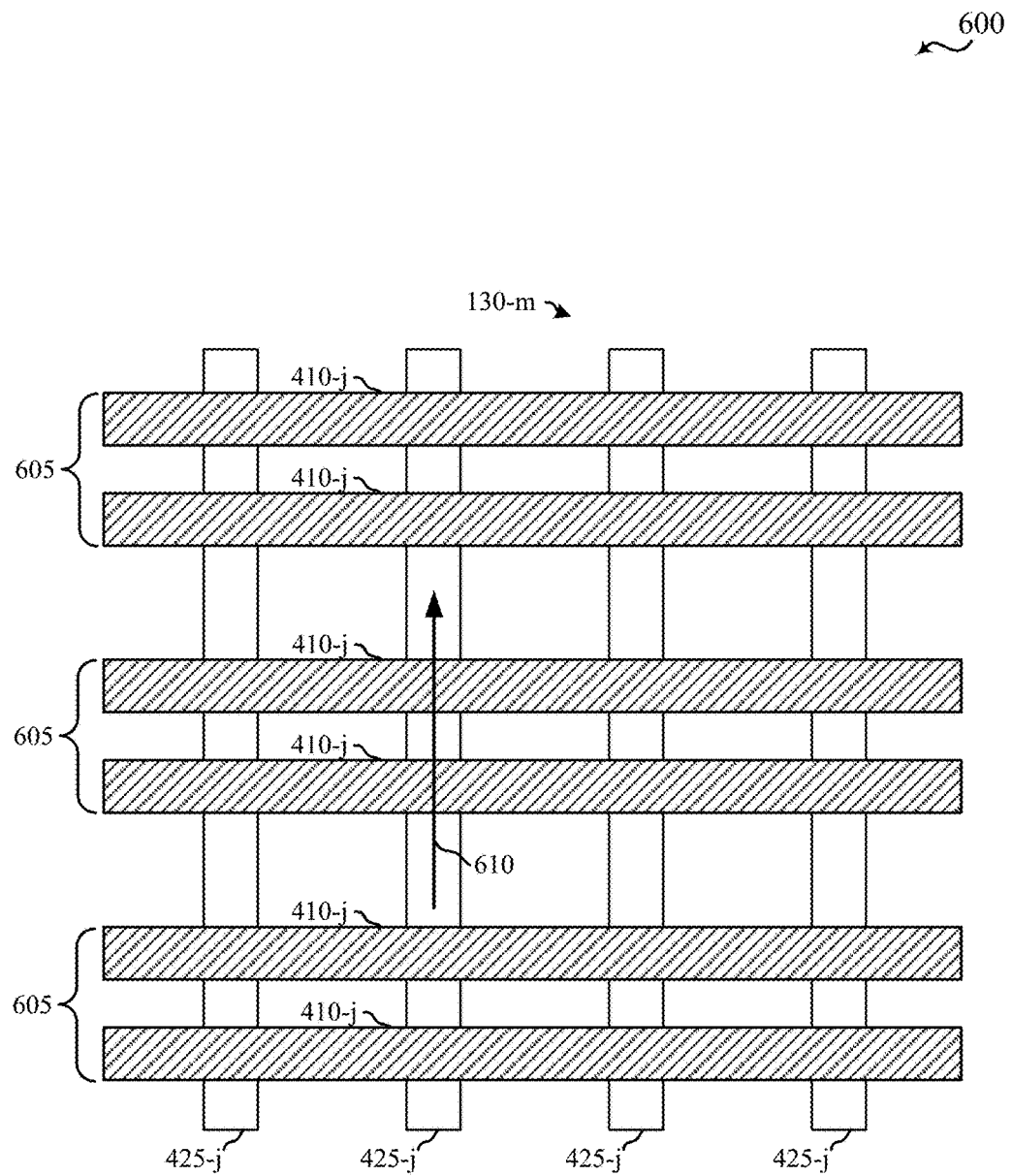
FIGS. 6A-6C show examples of a wire traces and impedance control structures for a flexible dynamic loop in accordance with various aspects of this disclosure.
Figure 6B:
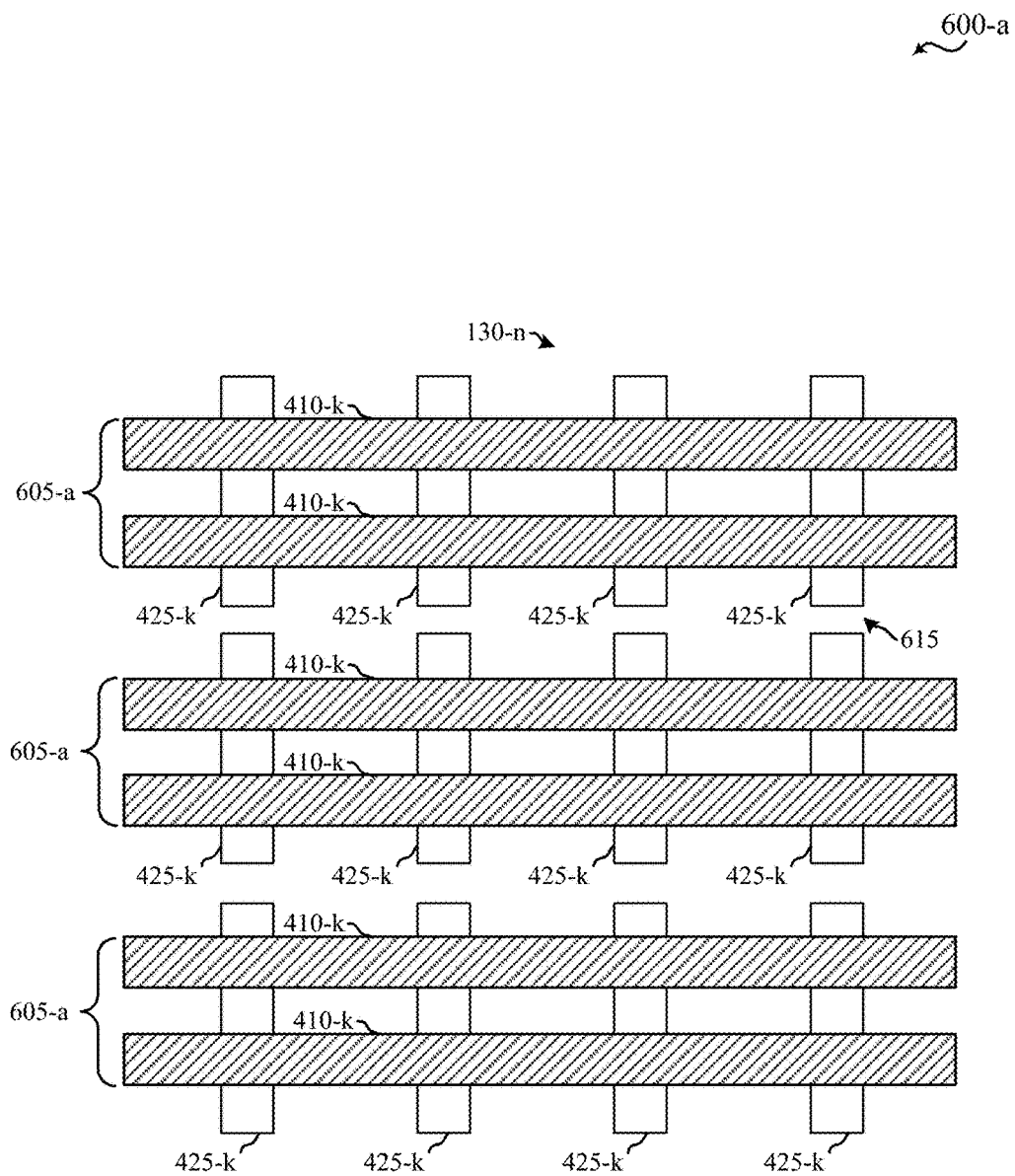
Figure 6C:
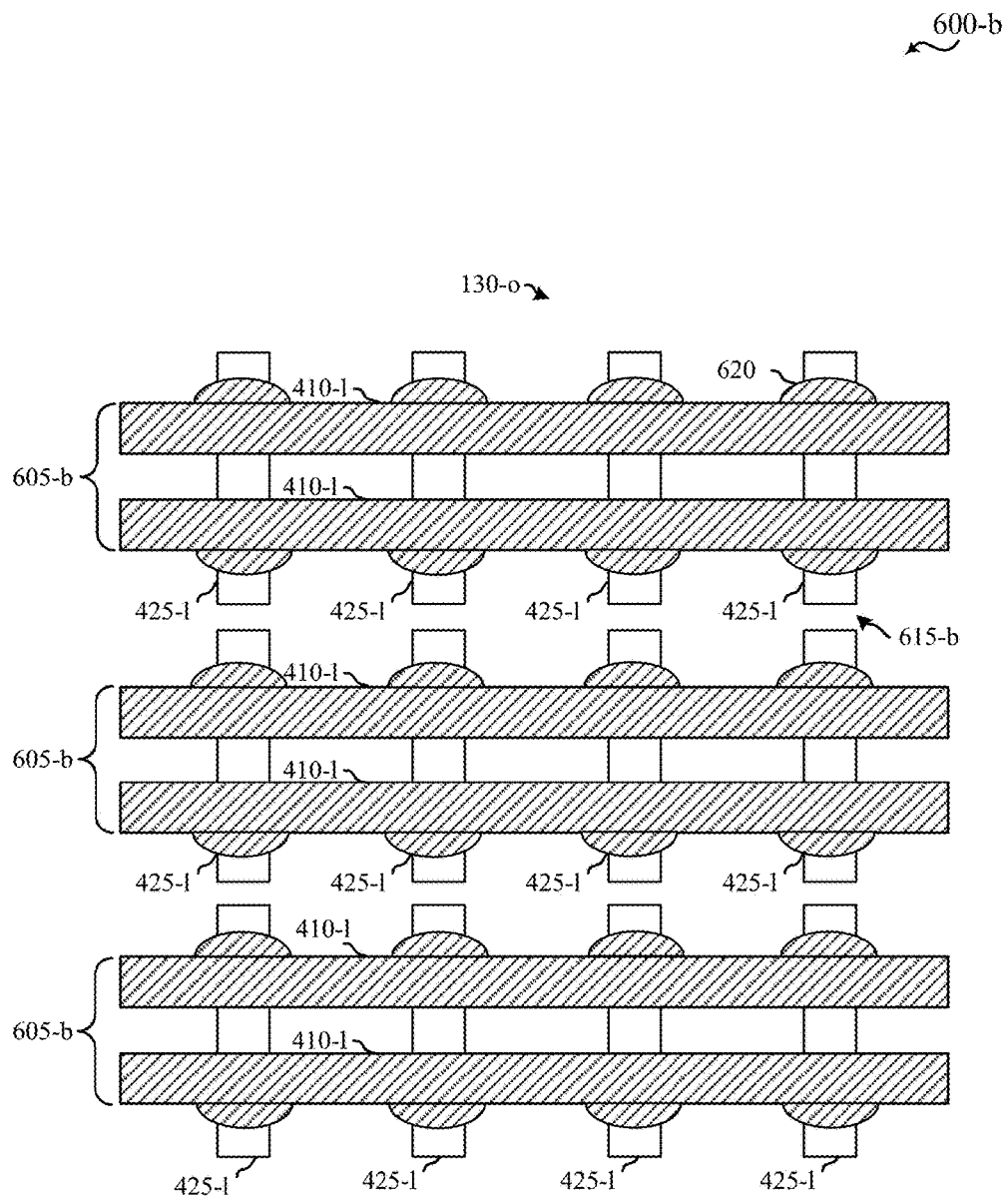

FIGS. 6A-6C show examples of a wire traces and impedance control structures for a flexible dynamic loop in accordance with various aspects of this disclosure. FIGS. 6A-6C show a backside view of flexible dynamic loops 130, showing impedance control structures 425 under differential pair wire traces 410. The flexible dynamic loops 130-*m* through 130-*o* of FIGS. 5A-5F may be examples of one or more aspects of the flexible dynamic loop 130 of FIGS. 1-4.

FIG. 6A shows a back side view 600 of an example of a flexible dynamic loop 130-*m*. The flexible dynamic loop 130-*m* includes wire traces 410-*j* grouped into differential pairs 605. Impedance control structure 425-*j* are formed approximately perpendicular to the differential pairs 605. As with some of the other embodiments described herein, an electric field 610 in the impedance control structures 425-*j* is a common mode field that periodically interacts between all of the wire traces 410-*j* and reduces the isolation between them.

FIG. 6B shows a back side view 600-*a* of an example of a flexible dynamic loop 130-*n*. The flexible dynamic loop 130-*n* includes wire traces 410-*k* grouped into differential pairs 605-*a*. Impedance control structure 425-*k* are formed approximately perpendicular to the differential pairs 605-*a*. To improve isolation between the differential pairs 605-*a*, splits 615 in the impedance control structures 425-*k* may be formed. This limits stray field and currents from interacting with adjacent differential pairs 605-*a*.

Furthermore, to achieve this isolation and to have additional impedance reduction, a periodic increase in the width of the wire traces 410-*k* can be added. This may require that both the backside impedance control structures 425-*k* and the trace width increase are staggered with respect to each other, as in FIGS. 5C and 5D.

In one example, the set of wire traces 410-*k* may be grouped into differential pairs and a length of each impedance control structure 425-*d* may be longer than a lateral width of the flexible structure that is covered by a differential pair 605-*a* of the wire traces 410-*k*. In some examples, the set of impedance control structures 425-*k* changes the impedance level by causing an electrical notch in a frequency content at a wavelength divided by two, which is higher than a frequency of a differential path of the set of wire traces 410-*k*.

For example, this periodic island feature or discontinuity can be intentionally designed such that a notch filter is created at high frequencies to reduce unwanted noise. In some examples, the noise may be eliminated entirely. This feature can be designed in combination with all of examples described herein. In other examples, this feature can be intentionally designed separately from the examples directed toward impedance control. To accomplish this notch filter effect, the impedance control structures 425-*k* may be spaced such that the wavelength of that spacing places a notch in the frequency over the unwanted noise. The placement of the periodic discontinuities creates an evanescent mode (decaying) such that the through propagation of a frequency of interest is not supported by the wave-guide or interconnect structure. This can be used to filter out noise and other frequencies of interest. Equation 2 shows the frequency of the notch ($f_{notch}$) as a function of the differential mode propagation velocity (v) and the spacing or pitch of the impedance control structures or discontinuity (λ).

$$f_{notch} = \frac{v}{2\lambda} \qquad (2)$$

FIG. 6C shows a back side view 600-b of an example of a flexible dynamic loop 130-o. The flexible dynamic loop 130-o includes wire traces 410-1 grouped into differential pairs 605-b. Impedance control structure 425-1 are formed approximately perpendicular to the differential pairs 605-b. The wire traces 410-1 include a plurality of bumps 620 formed on the wire traces 410-1. In one example, the bumps 620 may be formed on at least some of the set of wire traces 410-1, wherein the bumps 620 are formed over the impedance control structure 425-1. Forming the bumps 620 over the impedance control structures 425-1 may mean forming the bumps 620 on the wire traces 410-1 but placed geometrically to overlay the area where the impedance control structures 425-1 may be formed. In some examples, the bumps 620 are copper. In some examples, the bumps 620 may be formed of the same material as the wire traces 410-1.

In other examples, functional traces (VCM, power, ground, or other) may be included in both layers. While this may save significant space in the flexible dynamic loop 130, it may present problems in reliability due to a change in the neutral axis and strain to wire traces. Therefore, the impedance control structures 425 offer a reduction of the differential pair widths without an impact to the reliability.

Figure 7A:
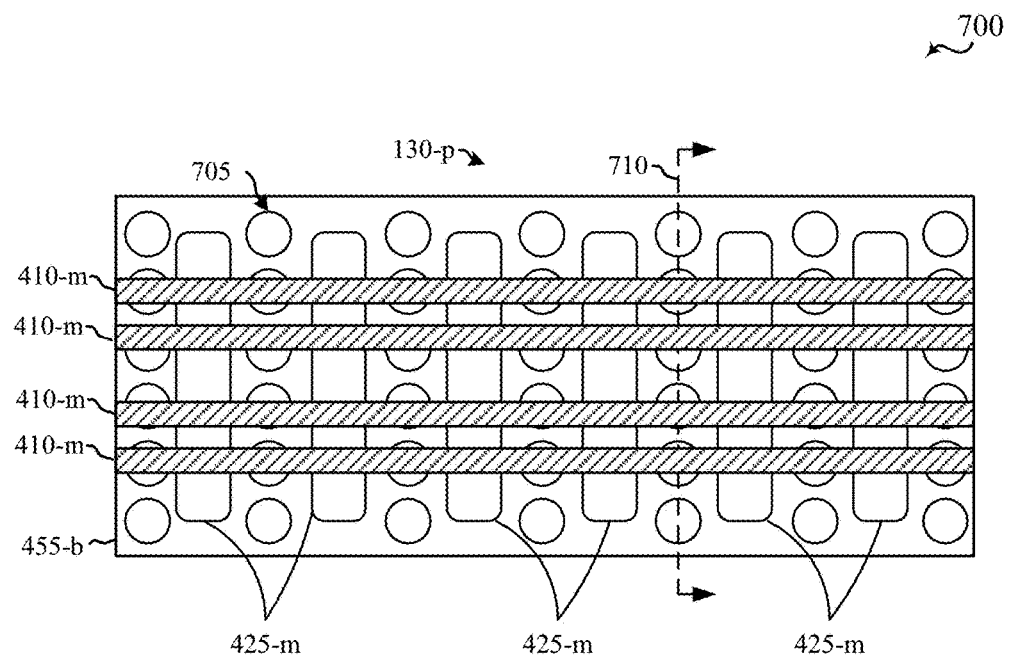
FIGS. 7A-7D show examples of a flexible dynamic loop having impedance control structures and a cover layer patterned with perforations in accordance with various aspects of this disclosure.
Figure 7B:
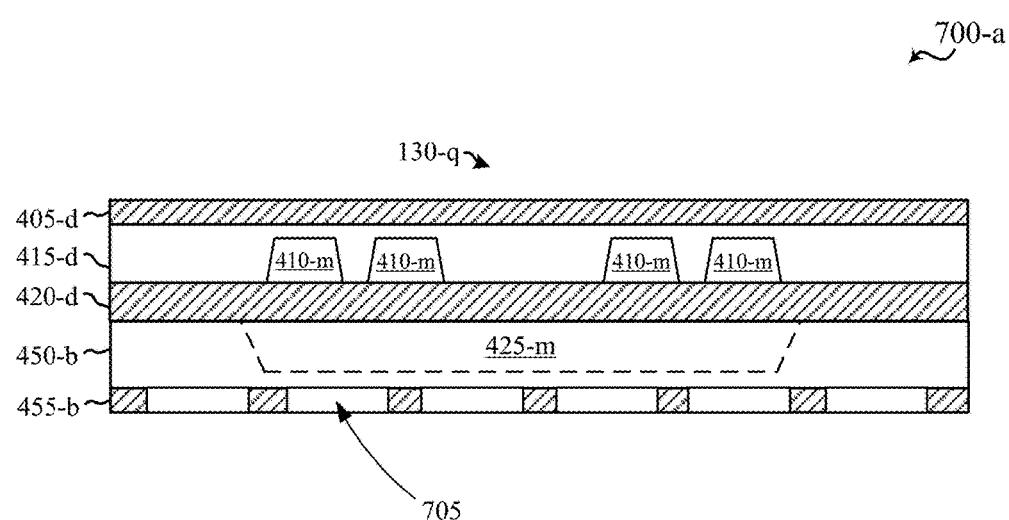

FIGS. 7A-7D show examples of a flexible dynamic loop 130 having impedance control structures 425 and a cover layer 455 patterned with perforations 705 in accordance with various aspects of this disclosure. FIG. 7A shows a cover layer 455-b including a plurality of perforations 705. To avoid copper flake off and damage in handling a back side impedance control structures 425-m, the cover layer 455-b may have been added over a secondary adhesive to contain the impedance control structure 425-m. However, the cover layer 455-b may add significant stiffness and may also change the neutral axis. Therefore, perforations 705 may be periodically added to reduce the stiffness in the flexible dynamic loop 130-p. These perforations 705 may be added periodically and have either full or partial depth (relative to the thickness of the cover layer 455-b) to allow for bending of the flexible dynamic loop 130-p. FIG. 7B shows a cross sectional view of the example of FIG. 7A along line 710.

Figure 7C:
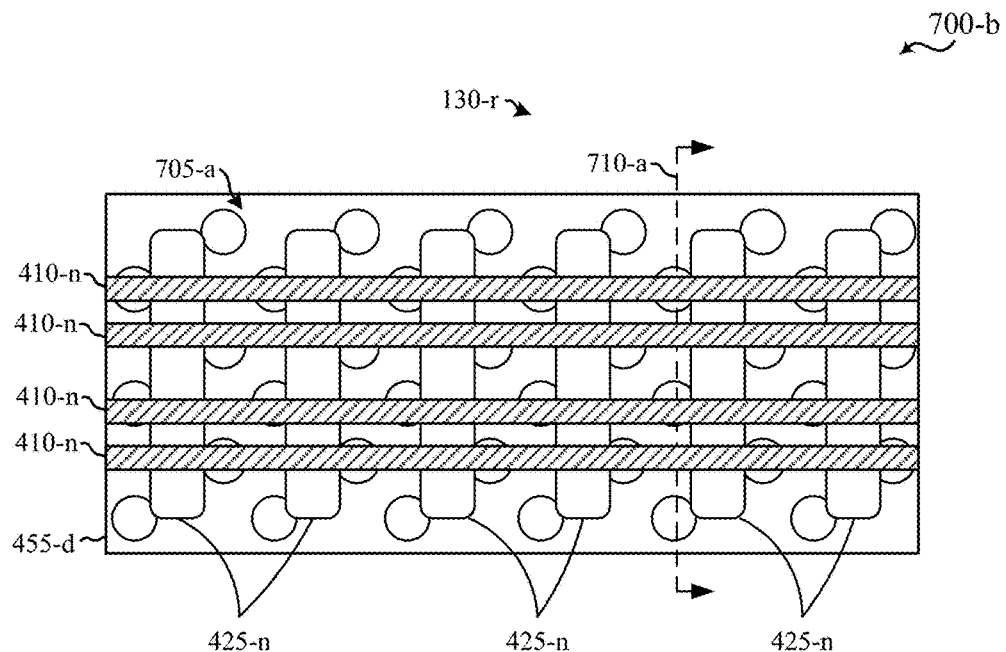
Figure 7D:
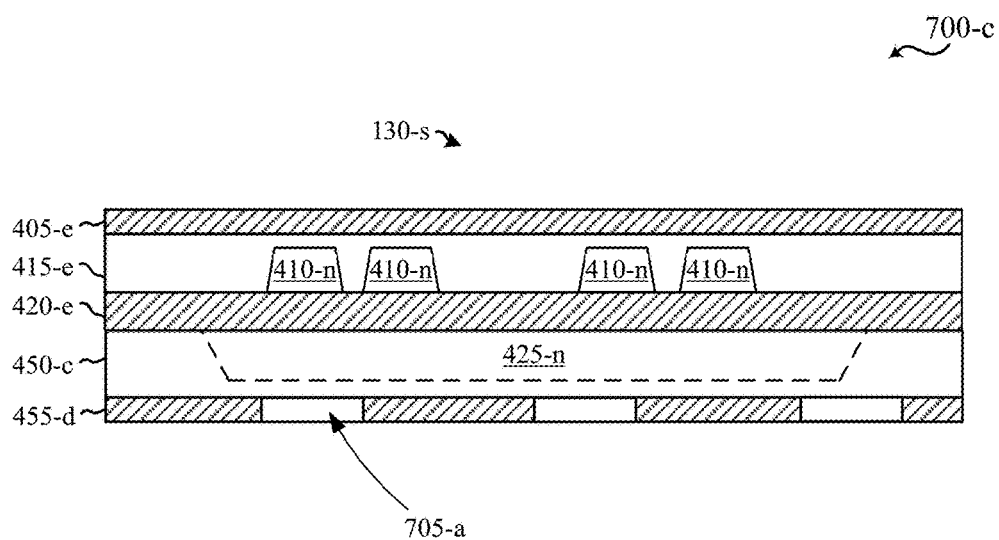

FIG. 7C shows a cover layer 455-d including a plurality of perforations 705-a in a honeycomb type punch-out pattern. This design may help protect the backside impedance control structures 425-n with a reduced stiffness while avoiding a creasing effect that may otherwise be introduced by the presence of the perforations 705-a. FIG. 7D shows a cross sectional view of the example of FIG. 7C along line 710-a.

Figure 8:
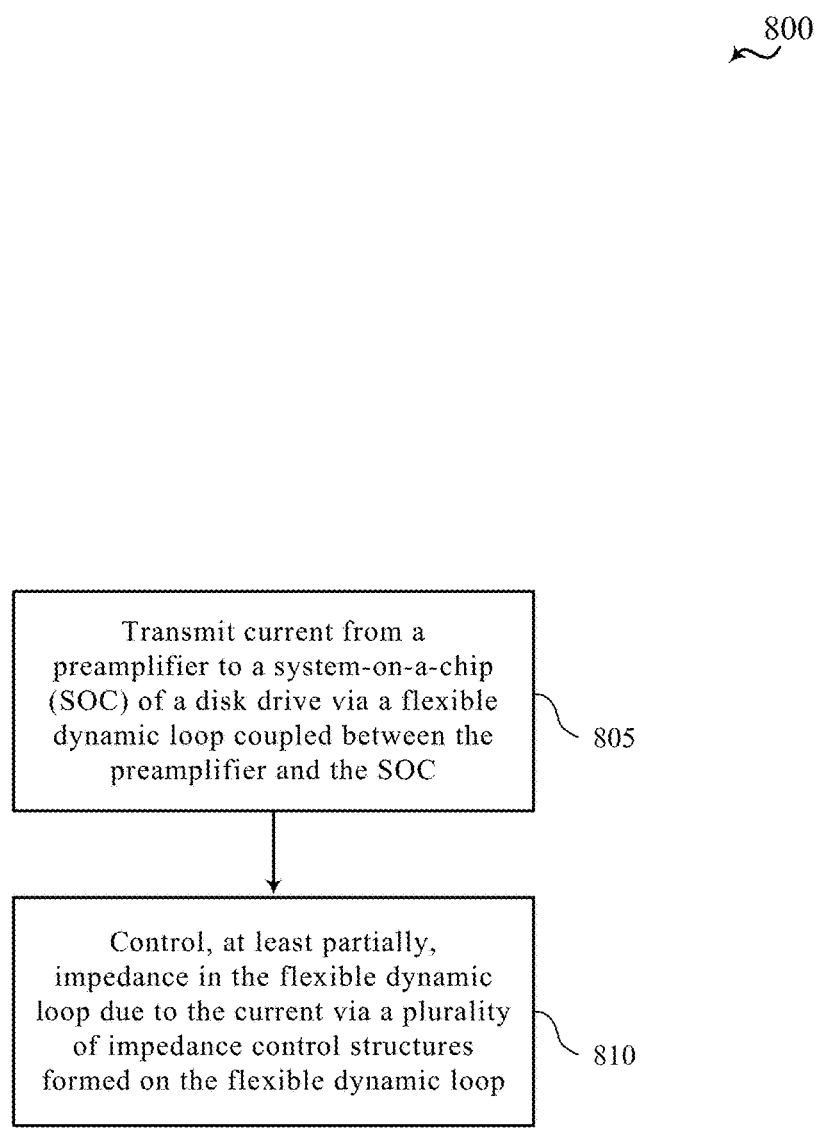
FIG. 8 is a flow chart illustrating an example of a method in accordance with various aspects of this disclosure.

FIG. 8 is a flow chart illustrating an example of a method 800 in accordance with various aspects of this disclosure. One or more aspects of the method 800 may be implemented in conjunction with the flexible dynamic loops 130 of FIGS. 1-7C. At block 805, the method 800 may include transmitting current from a preamplifier to a system-on-a-chip (SOC) of a disk drive via a flexible dynamic loop coupled between the preamplifier and the SOC. At block 810, the method 800 may further include controlling, at least partially, impedance in the flexible dynamic loop due to the current via a plurality of impedance control structures formed on the flexible dynamic loop. In some examples, controlling, at least partially, impedance in the flexible dynamic loop further includes reducing impedance in a plurality of wire traces in the flexible dynamic loop.

The operation(s) at blocks 805 and 810 may be performed using the flexible dynamic loop 130 described with reference to FIGS. 1-7C. Thus, the method 800 may provide for alleviating impedance in the wire traces while still providing flexibility. It should be noted that the method 800 is just one implementation and that the operations of the method 800 may be rearranged, omitted, and/or otherwise modified such that other implementations are possible and contemplated.

Other example methods may include a process for manufacturing the flexible dynamic loops 130 with the impedance control structures 425. A set of wire traces may be formed on a flexible middle layer. An adhesive layer may be formed over the wire traces to protect them and a cover layer may be formed over the adhesive layer. On the backside, a set of impedance control structures may be formed approximately perpendicular to the wire traces. The impedance control structures may be notched, staggered, perforated, isolated, or formed as described in any of the examples herein. In some examples, a second adhesive layer may be formed over the impedance control structures to protect them, and a second cover layer may be formed over the second adhesive layer. In some examples, some wire traces may be formed on the back side as well.

Thus, to alleviate the problem of impedance occurring in wire traces and limited real estate, a dual layer copper flex circuit technology can be used to place non-critical features in a second layer to allow for a reduction in trace width needs specifically in the high speed differential pairs. In traditional single layer designs, the trace widths on differential pairs may be too large to grab additional capacitance to lower the impedance. The periodic copper features described herein (and referred to as impedance control structures) on the second copper layer can add additional capacitance such that the trace widths can be reduced to save significant space. In some examples, the real estate needed for three sets of differential pairs can be roughly cut in half. In other examples, other gains in real estate may be found.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, e.g., a combination of a DSP and a microprocessor, multiple microprocessors, one or more microprocessors in conjunction with a DSP core, and/or any other such configuration.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC (e.g., A and B and C).

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, and/or other optical disk storage, magnetic disk storage or other magnetic storage devices, or any other medium that can be used to carry or store desired program code means in the form of instructions or data structures and that can be accessed by a general-purpose or special-purpose computer, and/or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, and/or wireless technologies such as infrared, radio, and microwave are included in the definition of medium. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein but is to be accorded the broadest scope consistent with the principles and novel features disclosed.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclosed.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclosed herein may also be implemented using software modules that perform certain tasks. These software modules may include script, batch, and/or other executable files that may be stored on a computer-readable storage medium or in a computing system. In some embodiments, these software modules may permit and/or instruct a computing system to perform one or more of the exemplary embodiments disclosed here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A flexible dynamic loop for a storage system apparatus, comprising:
   a flexible structure having a set of wire traces; and
   a set of impedance control structures on the flexible structure oriented substantially perpendicular to a bend radius of the flexible structure, wherein the set of impedance control structures change an impedance level experienced by at least some of the set of wire traces.

2. The flexible dynamic loop of claim 1, further comprising:
a cover layer formed over the set of impedance control structures.

3. The flexible dynamic loop of claim 2, wherein the cover layer is patterned with perforations.

4. The flexible dynamic loop of claim 1, further comprising:
a flexible layer formed between the set of wire traces and the set of impedance control structures.

5. The flexible dynamic loop of claim 1, wherein the set of impedance control structures further comprises:
a first set of impedance control structures; and
a second set of impedance control structures, wherein the second set of impedance control structures are staggered along a length of the flexible structure relative to the first set of impedance control structures.

6. The flexible dynamic loop of claim 1, further comprising:
at least one flexible rail connecting at least some of the set of impedance control structures, wherein the at least one flexible rail is formed along a length of the flexible structure.

7. The flexible dynamic loop of claim 1, comprising:
a first polyimide cover layer formed over the set of wire traces;
a first adhesive layer formed around the set of wire traces and under the first polyimide cover layer;
wherein the flexible structure is a middle layer formed between the set of wire traces and the set of impedance control structures;
a second adhesive layer formed around the set of impedance control structures; and
a second polyimide cover layer formed over the second adhesive layer.

8. The flexible dynamic loop of claim 1, wherein the set of impedance control structures changes the impedance level by causing an electrical notch in frequency content at a wavelength divided by two, which is higher than a frequency of a differential path of the set of wire traces.

9. The flexible dynamic loop of claim 1, wherein each of the set of impedance control structures are placed a distance apart such that a mechanical stiffness of the flexible dynamic loop is below a stiffness threshold.

10. The flexible dynamic loop of claim 1, wherein the set of wire traces are grouped into differential pairs and a length of each impedance control structure is longer than an area of the flexible structure covered by a differential pair of wire traces.

11. The flexible dynamic loop of claim 1, wherein a first end of the flexible dynamic loop communicatively couples with circuitry for a hard disk drive and a second end of the flexible dynamic loop communicatively couples with a channel preamplifier.

12. The flexible dynamic loop of claim 1, wherein two adjacent impedance control structures are separated by a window percentage, wherein the window percentage is a ratio of a width of an impedance control structure and a pitch between two adjacent impedance control structures.

13. The flexible dynamic loop of claim 1, further comprising:
bumps formed on at least some of the set of wire traces, wherein each bump overlays an impedance control structure of the set of impedance control structures.

14. A storage system apparatus comprising:
a preamplifier to supply current to a storage device;
a system-on-a-chip (SOC) of the storage device; and
a flexible dynamic loop connecting the preamplifier to the SOC, wherein the flexible dynamic loop comprises:
a flexible structure having a set of wire traces; and
a set of impedance control structures on the flexible structure oriented substantially perpendicular to a bend radius of the flexible structure, wherein the set of impedance control structures change an impedance level experienced by at least some of the set of wire traces.

15. The storage system apparatus of claim 14, further comprising:
a cover layer formed over the set of impedance control structures, wherein the cover layer is patterned with perforations.

16. The storage system apparatus of claim 14, wherein the set of impedance control structures further comprises:
a first set of impedance control structures; and
a second set of impedance control structures, wherein the second set of impedance control structures are staggered along a length of the flexible structure relative to the first set of impedance control structures, wherein each of the set of impedance control structures are placed a distance apart such that a mechanical stiffness of the flexible dynamic loop is below a stiffness threshold.

17. The storage system apparatus of claim 14, further comprising:
at least one flexible rail connecting at least some of the set of impedance control structures, wherein the at least one flexible rail is formed along a length of the flexible structure.

18. The storage system apparatus of claim 14, comprising:
a first polyimide cover layer formed over the set of wire traces;
a first adhesive layer formed around the set of wire traces and under the first polyimide cover layer;
a middle layer formed between the set of wire traces and the set of impedance control structures;
a second adhesive layer formed around the set of impedance control structures; and
a second polyimide cover layer formed over the second adhesive layer.

19. A method comprising:
transmitting current from a preamplifier to a system-on-a-chip (SOC) of a disk drive via a flexible dynamic loop coupled between the preamplifier and the SOC; and
controlling, at least partially, impedance in the flexible dynamic loop due to the current via a plurality of impedance control structures formed on the flexible dynamic loop.

20. The method of claim 19, wherein controlling, at least partially, impedance in the flexible dynamic loop further comprises:
reducing impedance in a plurality of wire traces in the flexible dynamic loop.

* * * * *